US009190386B2

(12) United States Patent
Su

(10) Patent No.: US 9,190,386 B2
(45) Date of Patent: Nov. 17, 2015

(54) SUBSTRATE, CHIP PACKAGE AND METHOD FOR MANUFACTURING SUBSTRATE

(71) Applicant: Zhen Ding Technology Co., Ltd., Tayuan, Taoyuan (TW)

(72) Inventor: Wei-Shuo Su, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 16 days.

(21) Appl. No.: 14/139,790

(22) Filed: Dec. 23, 2013

(65) Prior Publication Data

US 2015/0024552 A1    Jan. 22, 2015

(30) Foreign Application Priority Data

Jul. 22, 2013   (CN) .......................... 2013 1 03073495

(51) Int. Cl.
*H01L 23/00* (2006.01)
*H05K 3/46* (2006.01)
*H05K 3/00* (2006.01)

(52) U.S. Cl.
CPC ................ *H01L 24/83* (2013.01); *H01L 24/27* (2013.01); *H01L 24/29* (2013.01); *H05K 3/4614* (2013.01); *H05K 3/4697* (2013.01); *H05K 3/0097* (2013.01); *H05K 3/4682* (2013.01); *H05K 2201/10977* (2013.01); *H05K 2203/063* (2013.01); *H05K 2203/1536* (2013.01)

(58) Field of Classification Search
USPC ................................. 257/678–733, 787–796, 257/E23.001–E23.194; 438/15, 26, 51, 55, 438/64, 106, 114–127
See application file for complete search history.

(56) References Cited

U.S. PATENT DOCUMENTS 5,032,896 A  *  7/1991  Little et al. .................... 257/686
2012/0037935 A1 *  2/2012  Yang .............................. 257/98

FOREIGN PATENT DOCUMENTS

TW    201110836 A    3/2011
TW    201238422 A    9/2012

* cited by examiner

*Primary Examiner* — Mamadou Diallo
(74) *Attorney, Agent, or Firm* — Novak Druce Connolly Bove + Quigg LLP

(57) ABSTRACT

A substrate includes a first wiring substrate, a second wiring substrate, and an adhesive sheet. The first wiring substrate includes a number of first connecting pads and a first penetrating room. The second wiring substrate includes a number of second connecting pads. The adhesive sheet includes a number of through holes and a second penetrating room. The through holes are filled with a conducting material. The adhesive sheet and the first wiring substrate are orderly pressed on the second wiring substrate. The conducting material is connected to the first connecting pads and the second connecting pads. The first penetrating room of the first wiring substrate and the second penetrating room of the adhesive sheet cooperatively form a receiving recess.

8 Claims, 13 Drawing Sheets

SUBSTRATE, CHIP PACKAGE AND METHOD FOR MANUFACTURING SUBSTRATE

BACKGROUND

1. Technical Field

The present disclosure relates to a substrate, a chip package and a method for manufacturing the substrate.

2. Description of Related Art

Chip packages generally include a substrate and a chip mounted on the substrate. A thickness of the chip package is substantially equal to a total thickness of the substrate and the chip, which is often thicker than satisfactory.

Therefore, it is desirable to provide a substrate, a chip package having the substrate, and a method for manufacturing the substrate that can overcome the limitations described.

DETAILED DESCRIPTION

Embodiments of the disclosure will be described with reference to the drawings.

FIGS. 1-11 show a method for manufacturing a chip package 600 according to a first exemplary embodiment, and the method includes five steps.

In the first step, referring to FIGS. 1-5, a first wiring substrate 100 is provided.

Figure 1:
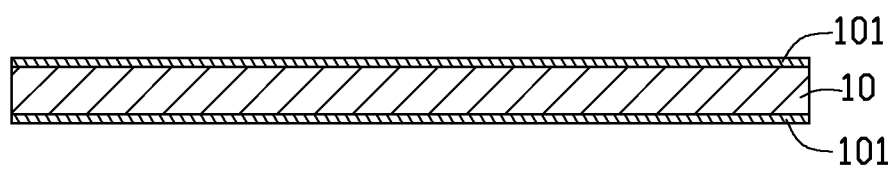
FIG. 1 is a cross-sectional view of a first supporting plate in accordance with a first exemplary embodiment.
Figure 2:
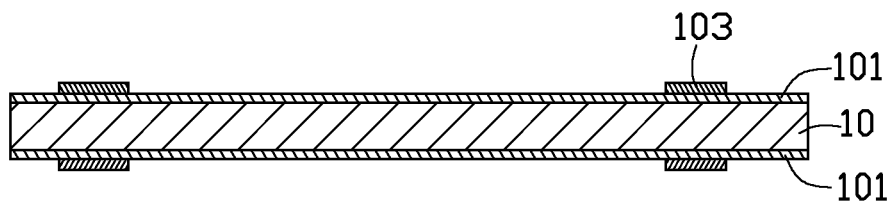
FIG. 2 is a cross-sectional view of a first wiring layer formed on the first supporting plate of FIG. 1.
Figure 3:
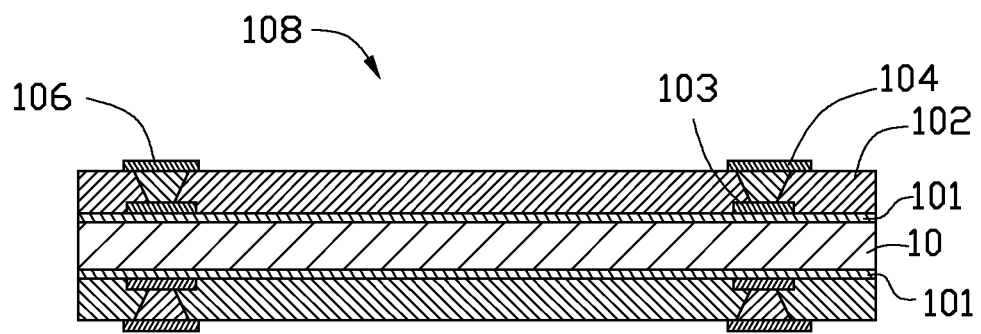
FIG. 3 is a cross-sectional view of a multilayer substrate including a number of dielectric layers and a number of wiring layers alternately formed on the first supporting plate of FIG. 2.
Figure 4:
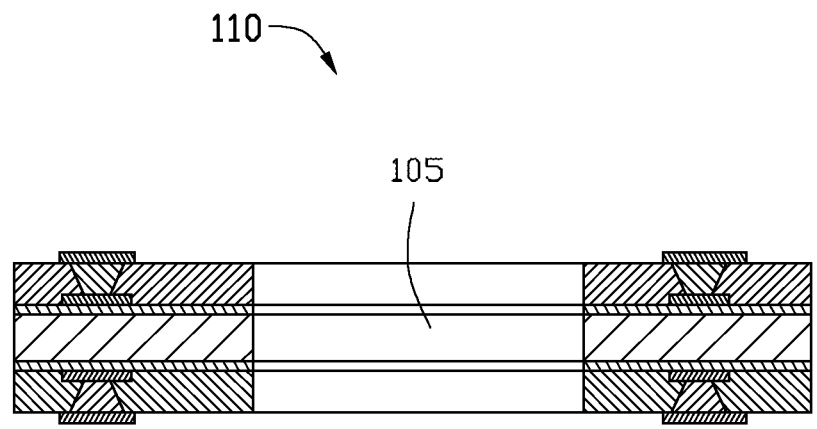
FIG. 4 is a cross-sectional view of a first substrate formed by a penetrating room defined in the multilayer substrate of FIG. 3.
Figure 5:
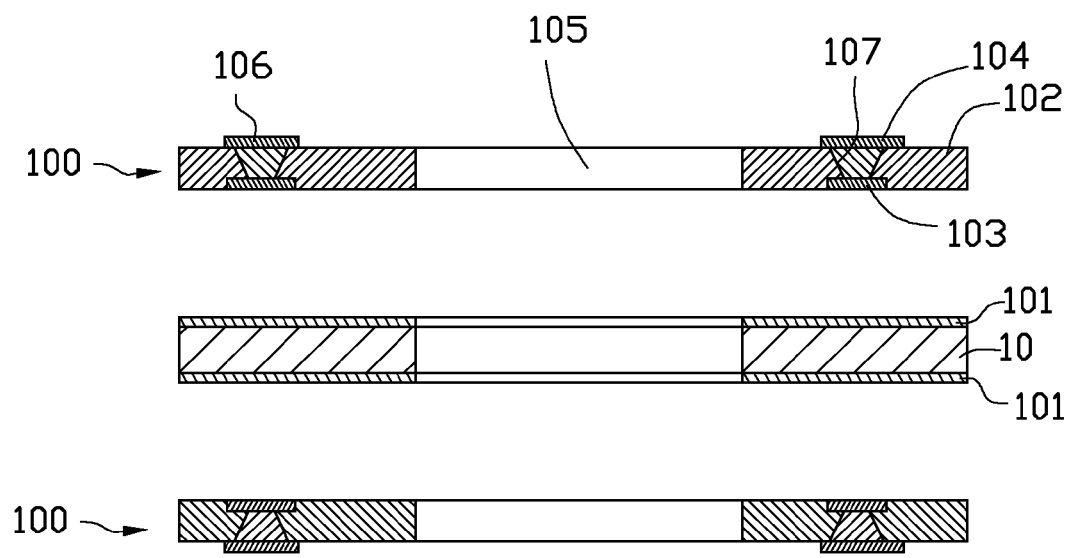
FIG. 5 is a cross-sectional view of a first wiring substrate formed by removing the first supporting plate from the first substrate of FIG. 4.

First, FIG. 1 shows that a first supporting plate 10 and two release films 101 are adhered on two opposite sides of the first supporting plate 10. Second, FIG. 2 shows that two copper foil layers (not shown) are formed on the two release film 101 respectively. Two first wiring layers 103 are formed by etching the two copper foil layers respectively. Third, FIG. 3 shows that two first dielectric layers 102 are pressed on the two first wiring layers 103 respectively. A second wiring layer 106 is formed on a side of each first dielectric layer 102 facing away from the first wiring layer 103. A number of first conductive via-holes 107 electrically connected between the first wiring layer 103 and the second wiring layer 106 are formed in the first dielectric layer 102. Each second wiring layer 106 includes a number of first connecting pads 104. A multilayer substrate 108 comprising the two first wiring layers 103, the two first dielectric layers 102, the two second wiring layers 106, and the first supporting plate 10 is formed. Fourth, FIG. 4 shows that a first substrate 110 is formed by defining a first penetrating room 105 in the multilayer substrate 108. The first penetrating room 105 penetrates through two opposite side of the first substrate 110. The first connecting pads 104 surround the first penetrating room 105. Fifth, FIG. 5 shows that two first wiring substrates 100 each comprising the first wiring layer 103, the first dielectric layer 102, and the second wiring layer 106 are peeled off from two opposite sides of the first substrate 110.

The first wiring substrate 100 includes the first dielectric layer 102, the first wiring layer 103 and the second wiring layer 106 formed on two opposite sides of the first dielectric layer 102 respectively, and the first conductive via-holes 107 formed in the first dielectric layer 102. The first conductive via-holes 107 are connected between the first wiring layer 103 and the second wiring layer 106. In the embodiment, the first conductive via-holes 107 are formed by plating copper in a blind hole (not labeled), or filling conductive ointment or resin material in the blind hole plated copper on an inner surface of the blind hole.

The first penetrating room 105 penetrates the second wiring layer 106, the first dielectric layer 102, and the first wiring layer 103. The first connecting pads 104 are electrically connected to the first conductive via-holes 107.

The first supporting plate 10 is configured for supporting the first dielectric layer 102 before the first wiring layer 103 and the second wiring layer 106 are formed on the first dielectric layer 102. The first supporting plate 10 can be made of polyimide, glass-fiber laminate, or metal.

The release film 101 is a double faced film. The release film 101 can be a plastic film processed by a method of an ion treatment or a fluoride treatment, or a thin-film processed by a method of spreading silicone. The first dielectric layer 102 can be separated from the release film 101 adhered on the first supporting plate 10.

Figure 6:
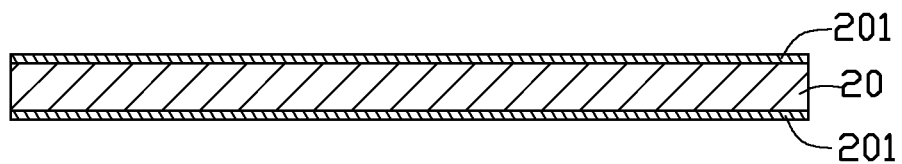
FIG. 6 is a cross-sectional view of a second supporting plate in accordance with the first exemplary embodiment.
Figure 7:
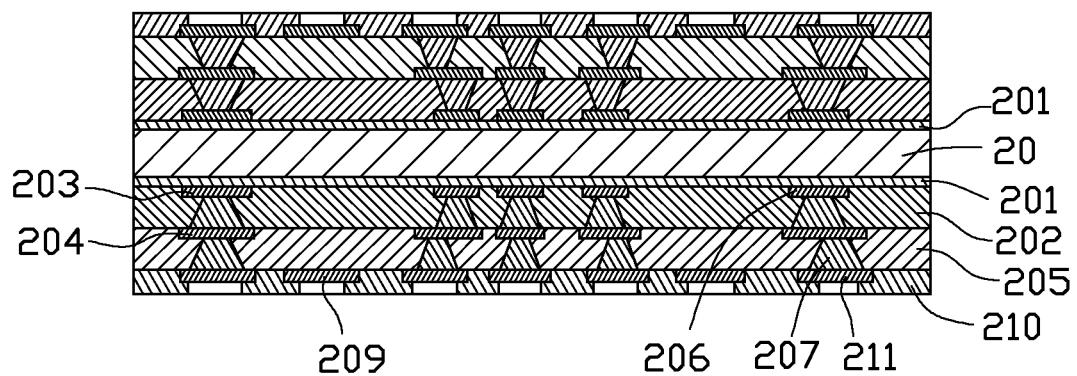
FIG. 7 is a cross-sectional view of a multilayer substrate including a number of dielectric layers and a number of wiring layers alternately formed on the second supporting plate of FIG. 6.
Figure 8:
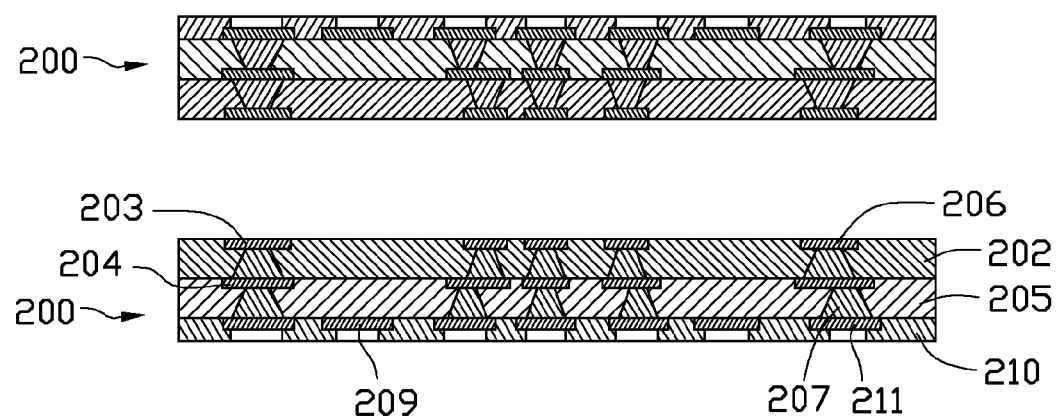
FIG. 8 is a cross-sectional view of a second wiring substrate formed by removing the second supporting plate from the first substrate of FIG. 4.

In the second step, referring to FIGS. 6-8, a second wiring substrate 200 is provided.

First, FIG. 6 shows that a second supporting plate 20 and two release films 201 are adhered on two opposite sides of the second supporting plate 20. Second, FIG. 7 shows that two copper foil layers (not shown) are formed on the two release films 201 respectively. Two third wiring layers 203 are formed by etching the two copper foil layers respectively. A second dielectric layer 202, a fourth wiring layer 204, a third dielectric layer 205, and a fifth wiring layer 209 are formed on each third wiring layer 203. A number of second conductive via-holes 207 electrically connected between the third wiring layer 203 and the fourth wiring layer 204 are formed in the second dielectric layer 202. A number of second conductive via-holes 207 electrically connected between the fourth wiring layer 204 and the fifth wiring layer 209 are formed in the third dielectric layer 209. Third, FIG. 8 shows that two second wiring substrates 200 each comprising the third wiring layer 203, the second dielectric layer 202, the fourth wiring layer 204, the third dielectric layer 205, and the fifth wiring layer 209 are peeled off from the second supporting plate 2.

The second wiring substrate 200 includes the second dielectric layer 202, the third wiring layer 203, the fourth wiring layer 204, the third dielectric layer 205, and the fifth wiring layer 209. The third wiring layer 203 and the fourth wiring layer 204 are formed on two opposite sides of the second dielectric layer 202. The fourth wiring layer 204 and the fifth wiring layer 29 are formed on two opposite sides of the third dielectric layer 205. The third wiring layer 203 includes a number of second connecting pads 206 electrically connected to the second conductive via-holes 207.

The second wiring substrate 200 further includes a solder masking layer 210 formed on the fifth wiring layer 209. Parts of the fifth wiring layer 209 exposing from a number of openings formed in the solder masking layer 210 serve as solder pads 211. The solder pads 211 are configured for connecting an electrical device or a circuit board.

In the embodiment, the second wiring substrate 200 can be manufactured by adding layers. The second conductive via-holes 207 are formed by plating copper in blind holes (not labeled), or plating copper on an inner surface of each blind hole and then filling conductive ointment or resin material in the blind holes.

Figure 9:
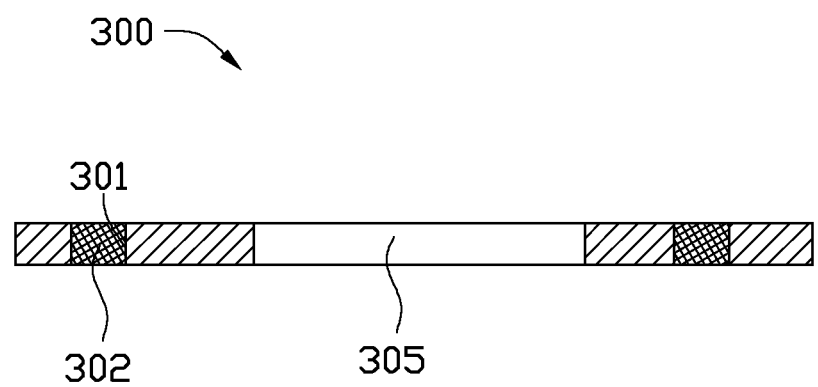
FIG. 9 is a cross-sectional view of an adhesive sheet in accordance with the first exemplary embodiment.

In the third step, FIG. 9 shows that an adhesive sheet 300 is provided.

The adhesive sheet 300 includes a number of through holes 301 corresponding to the first connecting pads 104 and a second penetrating room 305 corresponding to the first penetrating room 105. The through holes 301 surround the second penetrating room 305. The through holes 301 are filled with a conducting material 302. The position and the internal diameter of the first penetrating room 105 is the same as the position and the internal diameter of the second penetrating room 305.

The adhesive sheet 300 is a glass-reinforced epoxy laminate sheet, and is composed of glass fabric and epoxy resin. The through holes 301 and the second penetrating room 305 are drilled via a machine. The conducting material 302 can be conductive silver paste, conductive copper paste, or solder paste. In the embodiment, the conducting material 302 slightly overflows from the through holes 301.

Figure 10:
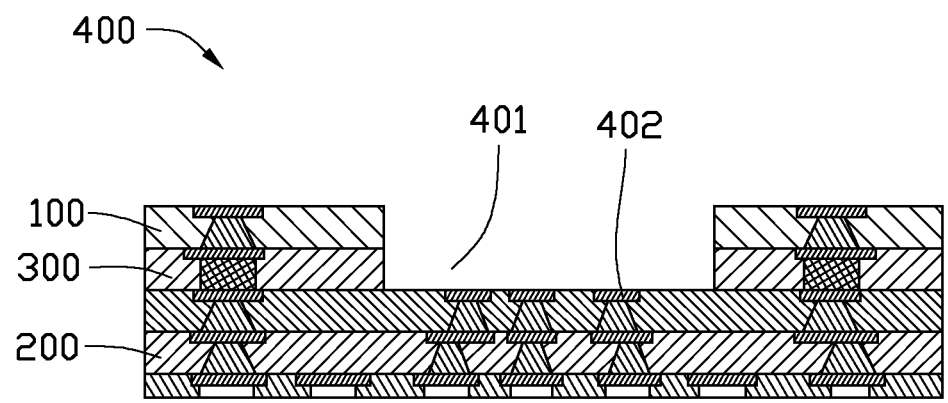
FIG. 10 is a cross-sectional view of a substrate including the adhesive sheet of FIG. 9 and the first wiring substrate of FIG. 5 orderly staked on the second wiring substrate of FIG. 8.

In the fourth step, FIG. 10 shows that by orderly staking the adhesive sheet 300 and the first wiring substrate 100 on the second wiring substrate 200 forms a substrate 400.

The conducting material 302 filled in the through holes 301 is electrically connected to the first connecting pads 104 and the second connecting pads 206. The first penetrating room 105 of the first substrate 110 communicates with the second penetrating room 305 of the adhesive sheet 300. One end of the second penetrating room 305 is sealed by the second wiring substrate 200, and a receiving recess 401 is cooperatively formed. Parts of the second wiring layer 203 of the second wiring substrate 200 exposing from the receiving recess 401 sever as first soldering pads 402.

Figure 11:
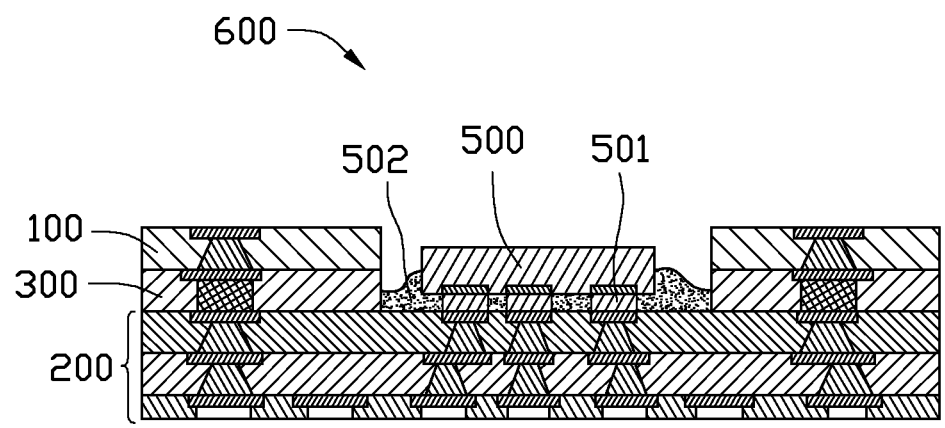
FIG. 11 is a cross-sectional view of a chip received in a receiving room of the substrate of FIG. 10.

In the fifth step, FIG. 11 shows that a chip 500 is received in the receiving recess 401, and is electrically connected to the substrate 400 forming a packing structure 600 comprising the substrate 400 and the chip 500.

A number of pins of the chip 500 are connected to the first soldering pads 402 via solder bumps 501. A glue 502 is filled in the receiving recess 401, and is adhered between the chip 500 and the second wiring substrate 200. The solder bumps 501 are generally made of tin.

A number of copper pillar bumps can be formed on the first soldering pads 402. The chip 500 is connected to the copper pillar bumps via a litter of tin. Therefore, the chip 500 having a greater electrode density can be mounted on the second wiring substrate 200. The chip 500 can be mounted on the second wiring substrate 200 via a wire-bonding method. More than two chips 500 can be received in the receiving recess 401. The chips 500 can be electrically connected to the first wiring substrate 100. As the chips 500 are received in the receiving recess 401, a thickness of the packing structure 600 is decreased.

The first wiring substrate 100 can comprise two or more wiring layers, and the second wiring substrate 200 can comprise three or more wiring layers.

FIG. 11 shows a chip package 600 including the first wiring substrate 100, the second wiring substrate 200, the adhesive sheet 300, and the chip 500.

The first wiring substrate 100 includes the first dielectric layer 102, the first wiring layer 103 and the second wiring layer 106 formed on two opposite sides of the first dielectric layer 102 respectively, and a number of the first conductive via-holes 107 formed in the first dielectric layer 102. The first conductive via-holes 107 are connected between the first wiring layer 103 and the second wring layer 106. The first wiring layer 103 includes a number of the first connecting pads 104 electrically connected to the first conductive via-holes 107.

The wiring substrate 100 has the first penetrating room 105, and the first penetrating room 105 penetrates the first wiring layer 103, the first dielectric layer 102, and the second wiring layer 106.

The second wiring substrate 200 includes the second dielectric layer 202, the third wiring layer 203 and the fourth wiring layer 204 formed on two opposite sides of the second dielectric layer 202 respectively, the third dielectric layer 205 formed on the fourth wiring layer 204, and the fifth wiring layer 209 formed on the third dielectric layer 205. A number of the second conductive via-holes 207 electrically connected between the third wiring layer 203 and the fourth wiring layer 204 are formed in the second dielectric layer 202, and a number of the second conductive via-holes 207 electrically connected between the fourth wiring layer 204 and the fifth wiring layer 209 are formed in the third dielectric layer 209. The third wiring layer 203 includes a number of the second connecting pads 206 electrically connected to the second conductive via-holes 207.

The adhesive sheet 300 includes a number of the through holes 301 corresponding to the first connecting pads 104 and the second penetrating room 305 corresponding to the first penetrating room 105. The through holes 301 are filled with the conducting material 302. The position and the internal diameter of the first penetrating room 105 is the same as the position and the internal diameter of the second penetrating room 305. The first wiring substrate 100 and the second wiring substrate 200 are adhered on two opposite sides of the adhesive sheet 300. The first connecting pads 104 are connected to the second connecting pads 206 via the conducting material 302. The first penetrating room 105 of the first wiring substrate 100 and the second penetrating room 305 of the adhesive sheet 300 form the receiving recess 401. The parts of the second wiring layer 203 of the second wiring substrate 200 exposing from the receiving recess 401 sever as the first soldering pads 402.

The chip package 600 further includes the solder bumps 501 and the adhering glue 502. The chip 500 is received in the receiving recess 401, and is electrically connected to the first soldering pad 402 via the solder bumps 501. The adhering glue 502 is adhered between the second wiring substrate 200 and the chip 500.

It should be understood, the first wiring substrate 100 can comprise two or more wiring layers, and the second wiring substrate 200 can comprises three or more wiring layers.

Figure 12:
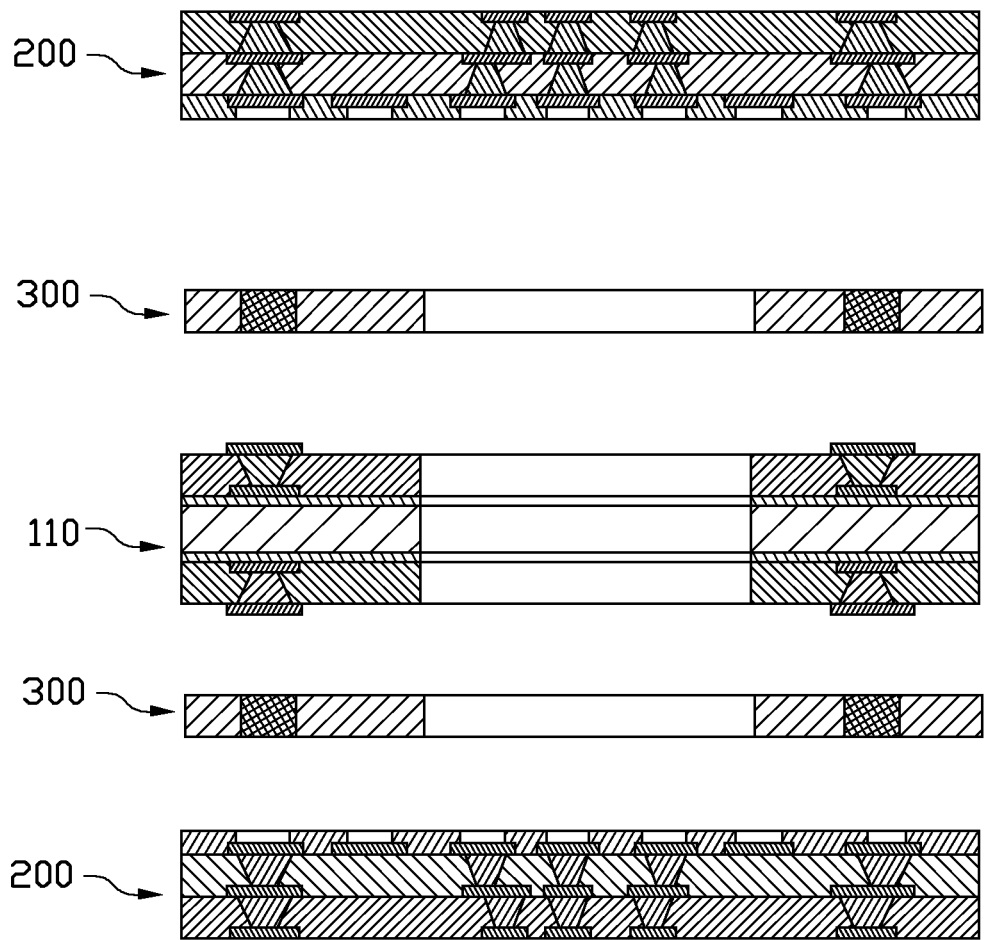
FIG. 12 is a cross-sectional view of the adhesive sheet of FIG. 9 and the second wiring substrate of FIG. 8 orderly staked on two opposite sides of the first substrate of FIG. 4 in accordance with a second exemplary embodiment.
Figure 13:
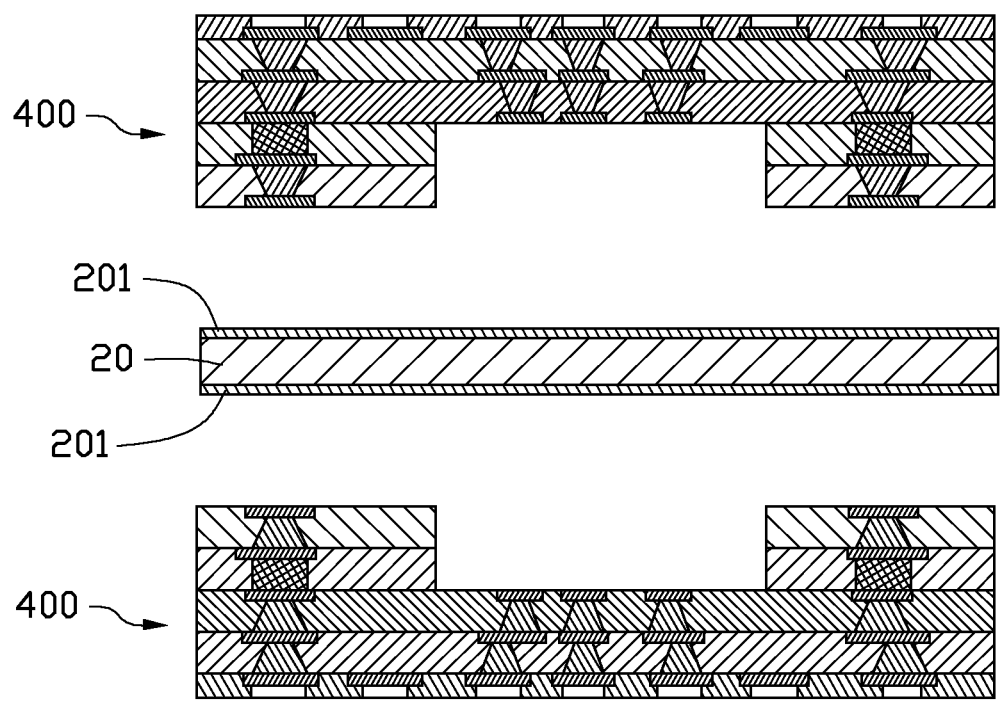
FIG. 13 is a cross-sectional view of the substrate of FIG. 10 formed by removing the supporting plate.

FIGS. 12-13 show a method for manufacturing a substrate 100 according to a second exemplary embodiment.

One first substrate 110 defining the first penetrating room 105, two second wiring substrates 200, and two adhesive sheets 300 defining the second penetrating room 305 are provided. One adhesive sheet 300 and one second wiring substrate 200 are orderly staked on two opposite sides of the first substrate 110. Then, two substrates 400 are peeled from the release film 101. The chip package 600 is formed via the method of the fifth step.

The difference between the method of the first exemplary embodiment and the method of the second exemplary embodiment is that the substrate 400 of the first embodiment is manufactured by pressing the first wiring substrate 100, the adhesive sheet 300, and the second wiring substrate 200 together after the first wiring substrate 100 separates from the first supporting plate 10. The substrate 400 of the second embodiment is manufactured by pressing the first wiring substrate 100, the adhesive sheet 300, and the second wiring substrate 200 together before the first wiring substrate 100 separates from the first supporting plate 10.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A method for manufacturing a substrate, comprising:
    providing a first supporting plate and two release films, the two release films being adhered on opposite sides of the first supporting plate being provided;
    forming a first wiring layer on each of the two release films;
    forming a first dielectric layer and a second wiring layer on each first wiring layer;
    defining a plurality of first conductive via-holes in the first dielectric layer, the first conductive via-holes electrically connecting the first wiring layer and the second wiring layer;
    defining a first penetrating room in the two first wiring layers, the first dielectric layer, and the second wiring layer;
    peeling the first wiring layer, the first dielectric layer, and the second wiring layer off from the first supporting plate to obtain the first wiring substrate;
    providing a second wiring substrate the second wiring substrate comprising a plurality of second connecting pads; and
    providing an adhesive sheet, the adhesive sheet defining a plurality of through holes and a second penetrating room, the through holes filled with a conducting material, the second penetrating room penetrating two opposite sides of the adhesive sheet; and
    orderly pressing the adhesive sheet and the first wiring substrate on the second wiring substrate, with the conducting material connected to the first connecting pads and the second connecting pads and the first penetrating room of the first wiring substrate and the second penetrating room of the adhesive sheet cooperatively forming a receiving recess.

2. The method of claim 1, wherein the first connecting pads are formed in the second wiring layer.

3. The method of claim 1, wherein providing the second wiring substrate comprises:
    providing a second supporting plate and two release films, the two release films adhered on two opposite sides of the second supporting plate;
    orderly forming a third wiring layer, a second dielectric layer, a fourth wiring layer, a third dielectric layer, and a fifth wiring layer on each release film;
    defining a plurality of second conductive via-holes in the second dielectric layer and the third dielectric layer, the second conductive via-holes in the second dielectric layer electrically connected between the third wiring layer and the fourth wiring layer, the second conductive via-holes in the third dielectric layer electrically connected between the fourth wiring layer and the fifth wiring layer;
    peeling the third wiring layer, the second dielectric layer, the fourth wiring layer, the third dielectric layer, and the fifth wiring layer off from the second supporting plate to obtain the second wiring substrate.

4. The method of claim 3, wherein a solder masking layer is formed on the fifth wiring layer, the fifth wiring layer exposing from the solder masking layer serve as solder pads.

5. The method of claim 4, wherein the first connecting pads surround the first penetrating room, and the through holes surround the second penetrating room.

6. A method for manufacturing a chip substrate, comprising:
    providing a first supporting plate and two release films, the two release films being adhered on opposite sides of the first supporting plate being provided;
    forming a first wiring layer on each of the two release films;
    forming a first dielectric layer and a second wiring layer on each first wiring layer;
    defining a plurality of first conductive via-holes in the first dielectric layer, the first conductive via-holes electrically connecting the first wiring layer and the second wiring layer;
    defining a first penetrating room in the two first wiring layers, the first dielectric layer, and the second wiring layer;
    peeling the first wiring layer, the first dielectric layer, and the second wiring layer off from the first supporting plate to obtain the first wiring substrate;
    providing a second wiring substrate, the second wiring substrate comprising a plurality of second connecting pads; and
    providing an adhesive sheet, the adhesive sheet comprising a plurality of through holes and a second penetrating room, the through holes filled with a conducting material, the second penetrating room penetrating two opposite sides of the adhesive sheet;
    orderly pressing the adhesive sheet and the first wiring substrate on the second wiring substrate, with the conducting material connected to the first connecting pads and the second connecting pads and the first penetrating room of the first wiring substrate and the second penetrating room of the adhesive sheet cooperatively forming a receiving recess; and
    placing a chip in the receiving recess, with the chip electrically connected to the second wiring substrate.

7. The method of claim 6, wherein parts of the second wiring layer of the second wiring substrate exposing from the receiving recess sever as first soldering pads, and the chip is electrically connected to the first soldering pads.

8. The method of claim 6, wherein an adhering glue is filled in the receiving recess, and is adhered between the chip and the second wiring substrate.

* * * * *